(12) United States Patent
Freund et al.

(10) Patent No.: US 9,536,838 B1
(45) Date of Patent: Jan. 3, 2017

(54) SINGLE CRYSTAL INGOT, SEMICONDUCTOR WAFER AND METHOD OF MANUFACTURING SEMICONDUCTOR WAFERS

(71) Applicant: Infineon Technologies AG, Neubiberg (DE)

(72) Inventors: Johannes Freund, Diesenhofen (DE); Helmut Oefner, Zorneding (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/821,992

(22) Filed: Aug. 10, 2015

(51) Int. Cl.
  *H01L 21/78* (2006.01)
  *H01L 23/544* (2006.01)
(52) U.S. Cl.
  CPC .............. *H01L 23/544* (2013.01); *H01L 21/78* (2013.01)

(58) Field of Classification Search
  CPC .... H01L 21/78; H01L 21/6836; H01L 23/544; H01L 2924/14; H01L 2223/54453
  USPC .......................................................... 438/462
  See application file for complete search history.

(56) References Cited

U.S. PATENT DOCUMENTS

| | | | | |
|---|---|---|---|---|
| 5,993,292 | A * | 11/1999 | Oishi ...................... | C30B 33/00 125/13.02 |
| 7,700,381 | B2 * | 4/2010 | Arikado ................ | H01L 23/544 356/237.2 |
| 8,389,099 | B1 * | 3/2013 | Matthews ............. | H01L 23/544 148/33.2 |

* cited by examiner

*Primary Examiner* — Quoc Hoang
(74) *Attorney, Agent, or Firm* — Murphy, Bilak & Homiller, PLLC

(57) ABSTRACT

An embodiment of a method of manufacturing semiconductor wafers comprises forming a notch or a flat in a semiconductor ingot extending along an axial direction. A plurality of markings are formed in the semiconductor ingot. At least some of the plurality of markings at different positions along the axial direction are distinguishable from each other by a characteristic feature. The semiconductor ingot is then sliced into semiconductor wafers.

21 Claims, 6 Drawing Sheets

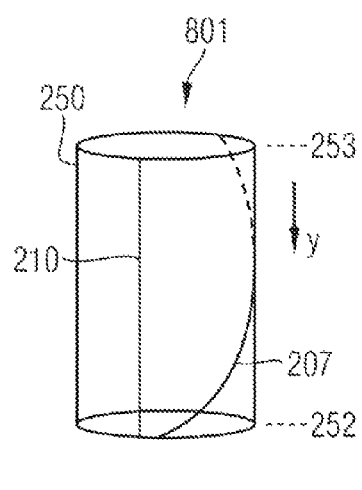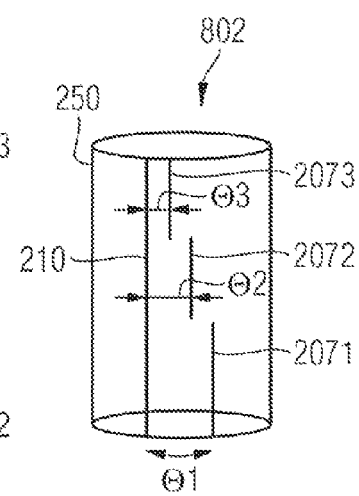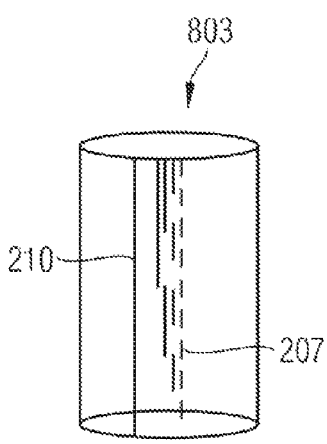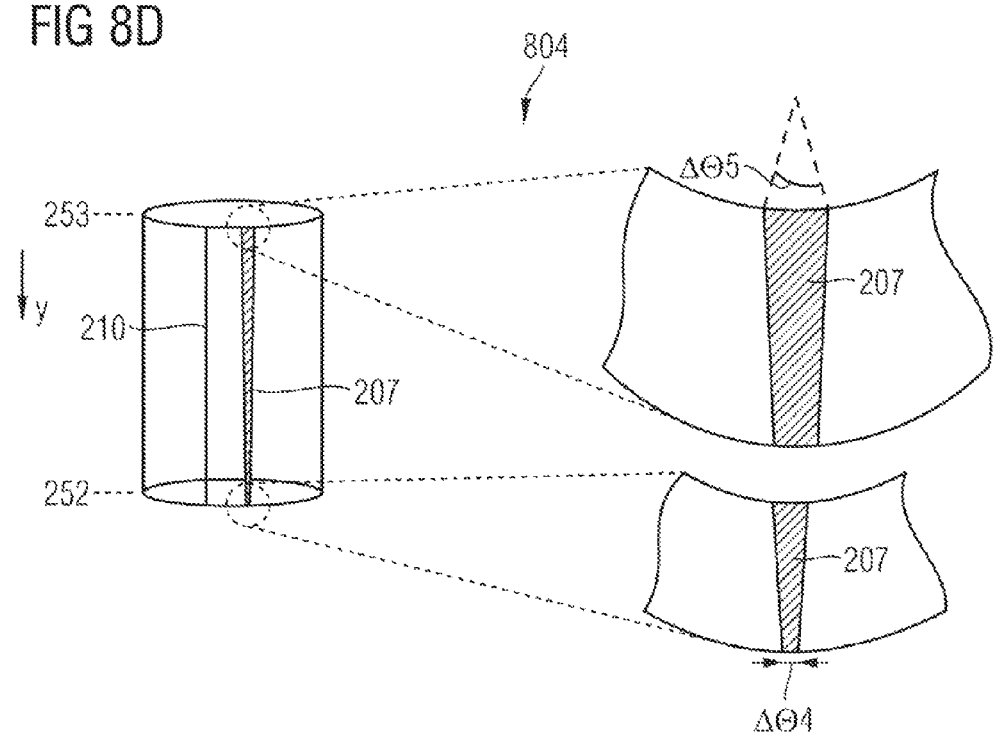

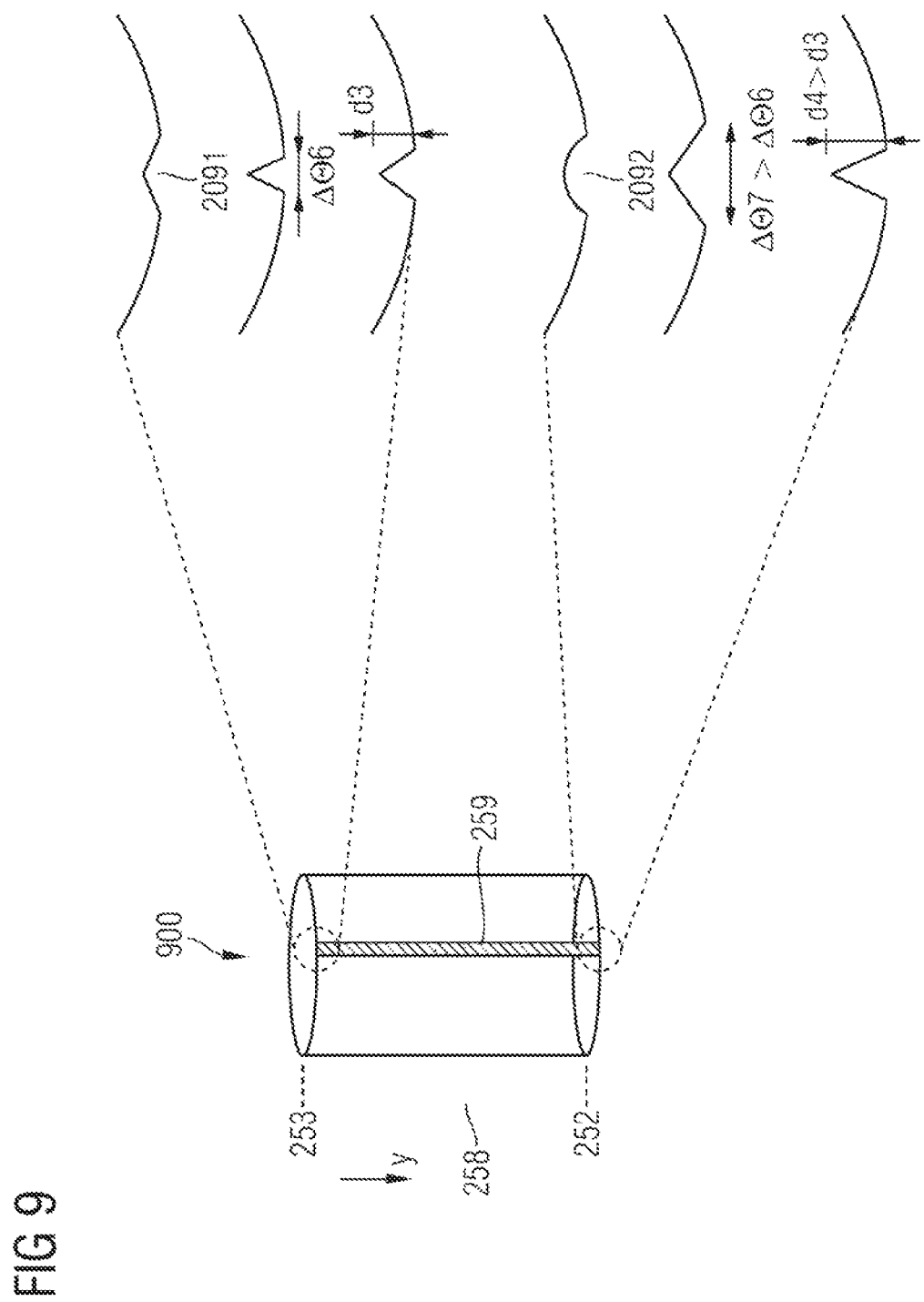

SINGLE CRYSTAL INGOT, SEMICONDUCTOR WAFER AND METHOD OF MANUFACTURING SEMICONDUCTOR WAFERS

BACKGROUND

Semiconductor doping processes are essential in front-end-of-line (FEOL) processing for manufacturing semiconductor zones of different conductivity type, for example p-doped and n-doped semiconductor zones. A precise and homogeneous doping of a semiconductor body, for example a background doping of a semiconductor wafer is desirable for meeting demands on specified device characteristics, for example demands on breakdown voltage, breakdown strength or softness. Meeting these demands becomes even more challenging when moving to greater ingots lengths and greater wafer diameters.

SUMMARY

The present disclosure relates to a method of manufacturing semiconductor wafers. The method comprises forming a notch or a flat in a semiconductor ingot extending along an axial direction. The method further comprises forming a plurality of markings in the circumference of the semiconductor ingot. At least some of the plurality of markings at different positions along the axial direction are distinguishable from each other by a characteristic feature. Thereafter, the method further comprises slicing the semiconductor ingot into semiconductor wafers.

The present disclosure also relates to a semiconductor wafer. The semiconductor wafer comprises a notch or a flat. The semiconductor wafer further comprises a marking in the circumference of the semiconductor wafer. An angular extension of the marking is smaller than 10°.

The present disclosure also relates to a single crystal ingot. The single crystal ingot comprises a notch or a flat extending along an axial direction. The single crystal ingot further comprises a plurality of markings in the circumference of the single crystal ingot. At least some of the plurality of markings at different positions along the axial direction are distinguishable from each other by a characteristic feature.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIGS. 8A to 8E depict schematic views of single crystal ingots for illustrating embodiments of markings in addition to a notch, according to an embodiment.

FIG. 9 is a schematic view of a single crystal ingot for illustrating a notch indicative of crystal orientation and axial position, according to an embodiment.

DETAILED DESCRIPTION

Figure 1:
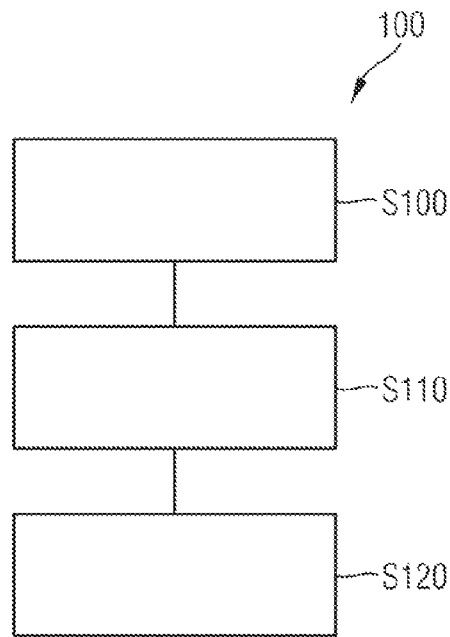
FIG. 1 is a schematic flow diagram for illustrating a method of manufacturing semiconductor wafers comprising a notch or a flat and a plurality of markings in the circumference of the semiconductor wafers, according to an embodiment.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having," "containing," "including," "comprising" and the like are open and the terms indicate the presence of stated structures, elements or features but not preclude the presence of additional elements or features. The articles "a," "an" and "the" are intended to include the plural as well as the singular, unless the context clearly indicates otherwise.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer," "substrate," "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material or wide band gap semiconductors like sapphire.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

FIG. 1 is a schematic flow diagram for illustrating a method 100 of manufacturing semiconductor wafers.

It will be appreciated that while method 100 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 comprises forming a notch or a flat in a semiconductor ingot extending along an axial direction. In some embodiments, the semiconductor ingot is a silicon ingot formed by a Czochralski (CZ) method, e.g. by the standard CZ method or by the magnetic CZ (MCZ) method or by the Continuous CZ (CCZ) method. In some other embodiments, the semiconductor ingot is a silicon ingot formed by a Float Zone (FZ) crystal growth process. The notch, which is typically used for larger wafer diameters, for example wafer diameters of 200 mm or greater or the flat, which is typically used for smaller wafer diameters, for example wafer diameters smaller than 200 mm may be formed by a machining process, for example by a grinding process using an appropriate grinding equipment, for example a grinding wheel. The notch is machined for positioning and orientation purposes. Likewise, the flat is machined for indicating type and orientation of the crystal. A so-called primary flat is located in the circumference of the wafer. The primary flat has a specific crystal orientation relative to the wafer surface. A so-called secondary flat indicates the doping concentration of the wafer. The location of this flat varies.

Process feature S110 comprises forming a plurality of markings in the circumference of the semiconductor ingot, wherein at least some of the plurality of markings at different positions along the axial direction are distinguishable from each other by a characteristic feature. Each of the plurality of markings serves for a different purpose than the flat or notch. The plurality of markings allow for a traceability of an axial wafer position in the ingot during FEOL processes, for example. In view of variations of characteristics along the axial direction of an ingot, for example variations of specific resistance due to segregation effects during CZ ingot growth or variations of contaminants, for example carbon (C) or oxygen (O), traceability of the axial wafer position allows for an improved determination of contaminants on a specific wafer which can be used for an improved FEOL processing, for example FEOL processing adapted to variations of characteristics along the axial direction of the ingot caused by a manufacturing process of the ingot. By way of example, on implantation doses, for example proton irradiation doses for adjusting a background doping concentration in a wafer may be more efficiently set when information on the axial position of the wafer to be processed is available.

Thereafter, process feature S120 is carried out. The process feature S120 comprises slicing the semiconductor ingot into semiconductor wafers. By way of example, after ends of the ingot are cut-off, the ingot may be cut into shorter sections in order to optimize the slicing operation that will follow later. Silicon wafers are typically sliced from the ingot using both an inner-diameter (ID) and wire type saws. After slicing, the "as-cut" wafers are cleaned, for example in a series of chemical baths to remove any residual slurry. From here, the wafers may proceed into a series of refining steps to make them stronger and flatter.

In some embodiments, the at least some of the plurality of markings at different positions along the axial direction are distinguishable from each other by an angular position relative to the notch or flat.

Figure 2:
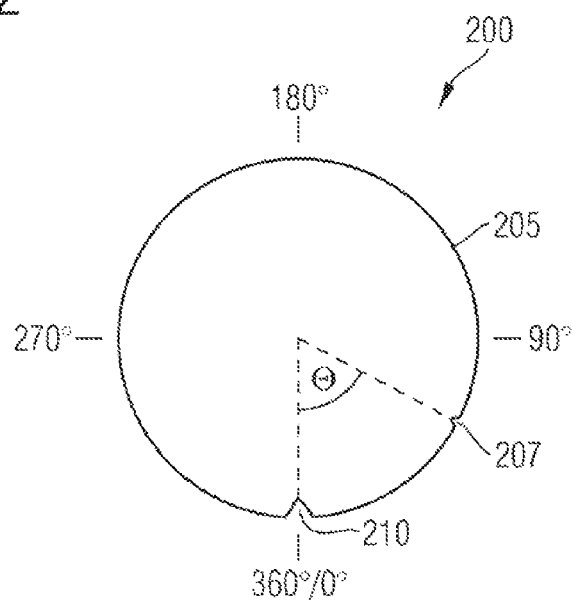
FIG. 2 is a schematic top view of a semiconductor wafer comprising a marking at an angular distance θ☐ from the notch, according to an embodiment.

In some embodiments, the plurality of markings are formed in the semiconductor ingot by rotating the semiconductor ingot between 0° and 360° around the axial direction while moving a marking position along the axial direction from a first axial position to a second axial position, thereby increasing an angular position of the markings with increasing distance from the first axial position. Rotating the semiconductor ingot between 0° and 360° may be applied in case that a front side and a back side of the semiconductor wafer can be distinguished, for example. In case the front side and the back side of the semiconductor wafer cannot be distinguished, the semiconductor ingot may be rotated between 0° and 180° around the axial direction while moving the marking position along the axial direction. Referring to the schematic top view 200 of a semiconductor wafer 205 of FIG. 2, traceability of the semiconductor wafer 205 may be achieved by the characteristic feature of an angular position θ of a marking 207 relative to a notch 210.

Figure 3:
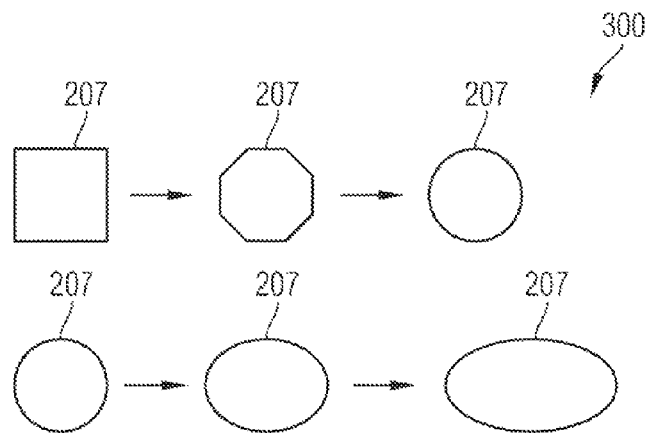
FIG. 3 depicts schematic views of markings changing in shape from a first characteristic shape to a second characteristic shape, according to an embodiment.

In some embodiments, the at least some of the plurality of markings at different positions along the axial direction are distinguishable from each other by marking shape. Information on the axial position may be mapped via a change of geometry of the marking, for example a change between different geometries such as a change between circular and ellipsoidal geometries, a change between circular and square geometries, a change between square and rectangular geometries. An exemplary illustration of a change of geometry of the marking 205 is schematically illustrated in the view 300 of FIG. 3. The view 300 is taken toward the circumference of the semiconductor wafer 205 along a radial direction, for example.

Figure 4:
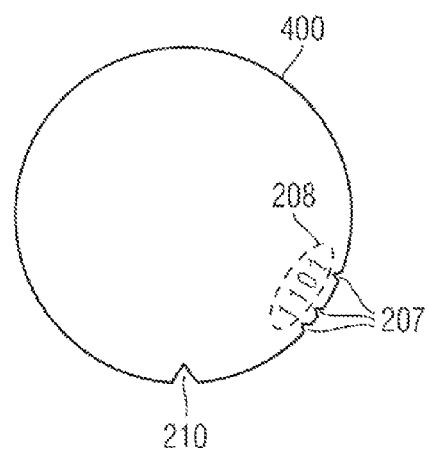
FIG. 4 is a schematic top view of a semiconductor wafer comprising a plurality of markings arranged along the circumference of the semiconductor wafer, the plurality of markings representing a digital code, according to an embodiment.
Figure 5:
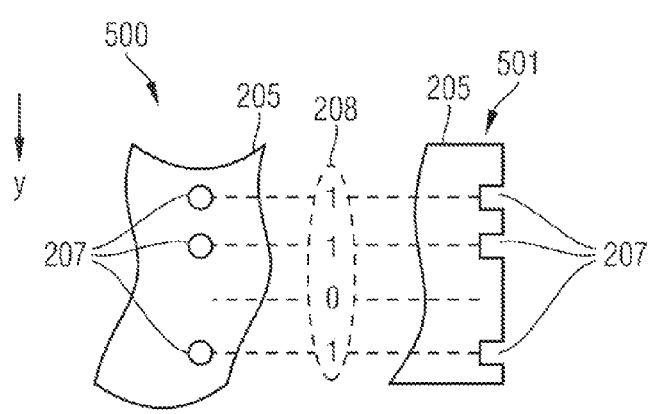
FIG. 5 is a schematic side view and a schematic sectional view of a semiconductor wafer comprising a plurality of markings arranged along an axial direction in the circumference of the semiconductor wafer, the plurality of markings representing a digital code, according to an embodiment.

In some embodiments, the characteristic feature representing the axial wafer position is a digital code in the circumference of the semiconductor wafer. Digital codes, for example binary numbers may be realized by the presence or absence of a marking along a sequence of possible marking positions. The markings representing the binary number may be arranged one after another along the circumference of the semiconductor wafer. An exemplary illustration of markings 207 arranged one after another along the circumference of the semiconductor wafer 205 is given in the schematic top view 400 of FIG. 4. The markings representing a binary number 208 may be arranged one after another along an axial direction y between opposite main surfaces of the semiconductor wafer 205. An exemplary illustration of markings 207 arranged one after another along the axial direction y between the opposite main surfaces of the semiconductor wafer 205 is given in the schematic side view 500 and the schematic sectional view 501 of FIG. 5. In some other embodiments, a combination of arrangement of the markings 207 illustrated in FIG. 4 and FIG. 5 may be applied.

Figure 6:
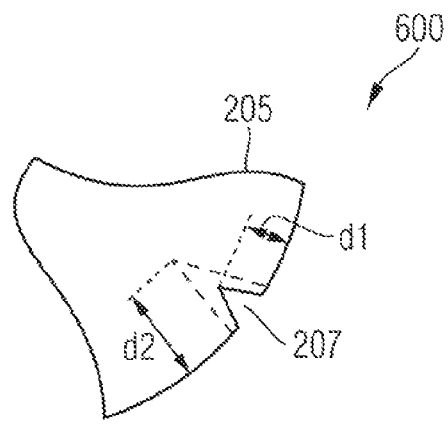
FIG. 6 is a schematic top view of a semiconductor wafer for illustrating markings having different radial extensions d1, d2 toward a center of the semiconductor wafer, according to an embodiment.

In some embodiments, the at least some of the plurality of markings at different positions along the axial direction are distinguishable from each other by a radial extension toward a center of the semiconductor wafer. An exemplary illustration of markings 207 having different radial extensions d1, d2 toward a center of the semiconductor wafer 205 is given in the schematic top view 600 of FIG. 6.

Figure 7:
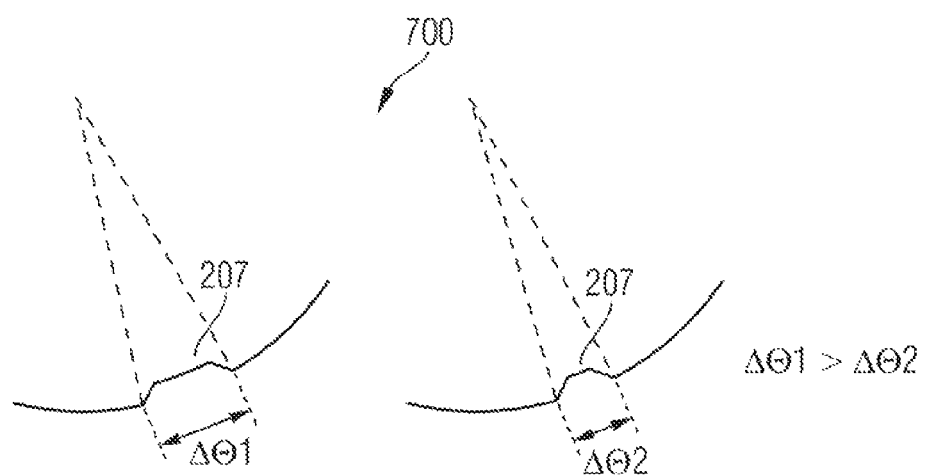
FIG. 7 is a schematic top view of a semiconductor wafer for illustrating markings having different angular extensions Δθ1, Δθ2, according to an embodiment.

In some embodiments, the at least some of the plurality of markings at different positions along the axial direction are distinguishable from each other by an angular extension. An exemplary illustration of markings 207 having different angular extensions □θ1, □θ2 is given in the schematic top view 700 of FIG. 7, wherein □θ1>□θ2.

In some embodiments, the plurality of markings are formed by at least one of laser marking and machining. One example of laser marking is laser engraving. The point where the laser touches the circumference of the semiconductor wafer may be on the focal plane of the laser's optical system. The area inside the focal point is significantly affected when the laser beam passes over the circumference of the semiconductor wafer. The energy delivered by the laser changes the surface of the semiconductor wafer under the focal point. It may heat up the surface and subsequently vaporize the semiconductor material. One example of machining is grinding, for example abrasive grinding technology by a grinding wheel such as a diamond grinding wheel. A depth of the marking may exceed a depth up to which a wafer edge rounding occurring after wafer sawing removes material along the wafer edge. The depth of the marking is typically in a range between 10 μm and 500 μm, or between 20 μm and 300 μm, or between 20 μm and 200 μm.

In some embodiments, the notch or flat and the plurality of markings are formed in a same process equipment.

In some embodiments, the marking position is moved along the axial direction by moving the semiconductor ingot relative to a marking process equipment or by moving the marking process equipment relative to the silicon ingot.

In some embodiments, at least two of the plurality of markings are formed at different angular positions with respect to at least one axial position. An example is a digital code represented by a binary number having more than two digits.

In some embodiments, a semiconductor wafer comprises a notch or a flat. The semiconductor wafer further comprises a marking in the circumference of the semiconductor wafer, wherein an angular extension of the marking is smaller than 10°, or smaller than 5°, or even smaller than 1°. By way of example, each one of the angular extensions Δθ1, Δθ2 of the markings 207 is smaller than 10°. Thus, each one of the markings 207 is different from a flat typically used to indicate crystal orientation and doping of the wafer in the form of a primary flat and a secondary flat.

The embodiments described with reference to the Figures above relate to characteristic features of the markings in the circumference of the semiconductor wafer and allow for a traceability of the position of the semiconductor wafer along an axial direction of the ingot from where it is cut. These embodiments can be combined. In other words, different characteristic features as described above may be combined to a new characteristic feature for allowing traceability of the semiconductor wafer.

Some embodiments relate to a single crystal ingot. The single crystal ingot comprises a notch or a flat extending along an axial direction. The single crystal ingot further comprises a plurality of markings in the circumference of the single crystal ingot. At least some of the plurality of markings at different positions along the axial direction are distinguishable from each other by a characteristic feature. In some embodiments, the single crystal ingot is a semiconductor ingot, for example a CZ silicon ingot.

Examples of the characteristic features are described with reference to FIGS. 2 to 7 may be applied to the single crystal ingot individually or in any combination.

Referring to the schematic view 801 of FIG. 8A, a single crystal ingot 250, for example a CZ silicon ingot includes a notch 210. The single crystal ingot 250 further includes a plurality of markings in the circumference of the single crystal ingot 250. At least some of the plurality of markings 207 at different positions along the axial direction y are distinguishable from each other by a characteristic feature. In the embodiment illustrated in FIG. 8A, the characteristic for distinguishing parts, for example wafers to be cut from the single crystal ingot 250 with respect to the axial position is an angular position of the marking with respect to the angular position of the notch 210. The angular distance between the markings 207 and the notch 210 increases with increasing distance from a first end 252 of the single crystal ingot 250 toward a second end 253 of the single crystal ingot 250. The markings 207 may be formed by rotating the single crystal ingot around the axial direction while moving a marking position along the axial direction from the first end 252 to the second end 253, thereby increasing an angular distance between the markings 207 and the notch 210. In the embodiment illustrated in FIG. 8A, the angular distance ranges between 0° and 180° being suitable for semiconductor wafers that cannot be distinguished between their front and back side. In case that the semiconductor wafer can be distinguished between the front side and the back side, the axial distance may range between 0° and 360°, for example.

Referring to the schematic view 802 of FIG. 8B, the single crystal ingot 250, for example a CZ silicon ingot includes a notch 210 includes groups of markings 2071, 2072, 2073. The markings of the groups differ from each other by the angular distance from the notch 210. An extension of each group along the axial direction y may be greater than a thickness of a wafer to be cut from the single crystal ingot 250. Thus, each of the groups may correspond to a section of the single crystal ingot 250 where a plurality of wafers are to be cut. In this case, some of the wafers may have markings that cannot be distinguished from each other. Marking groups of wafers to be cut from the single crystal ingot 250 may be desired in case that variations of characteristics along the axial direction of the single crystal ingot are acceptable with respect to the semiconductor wafers belonging to one group, for example. Alternatively, an extension of each group along the axial direction y may be smaller than a thickness of a wafer to be cut from the single crystal ingot 250, for example smaller than 70%, or smaller than 50%, or even smaller than 30%.

Referring to the schematic view 803 of FIG. 80 illustrating the single crystal ingot 250, at least two of the plurality of markings 207 are formed at different angular positions with respect to a same axial position along the axial direction y. Forming a plurality of markings 207 at a same axial position, i.e., with respect to one single wafer to be cut from the single crystal ingot 250, allows for stamping a wafer with a digital code such as a binary number. Examples of semiconductor wafers cut from the semiconductor ingot illustrated in FIG. 80 are described with reference to FIGS. 4 and 5.

Referring to the schematic view 804 of FIG. 8D illustrating the single crystal ingot 250, the markings 207 extend at a same angular distance from the notch 210 from the first end 252 to the second end 253 of the single crystal ingot 250. An angular dimension of the markings 207 increases from a value $\Delta\theta 4$ at the first end 252 to a value $\Delta\theta 5$ at the second end 253. The angular dimension $\Delta\theta$ represents the characteristic feature configured to identify a wafer cut from the single crystal ingot 250 with respect to its axial position before slicing.

Figure 8E:
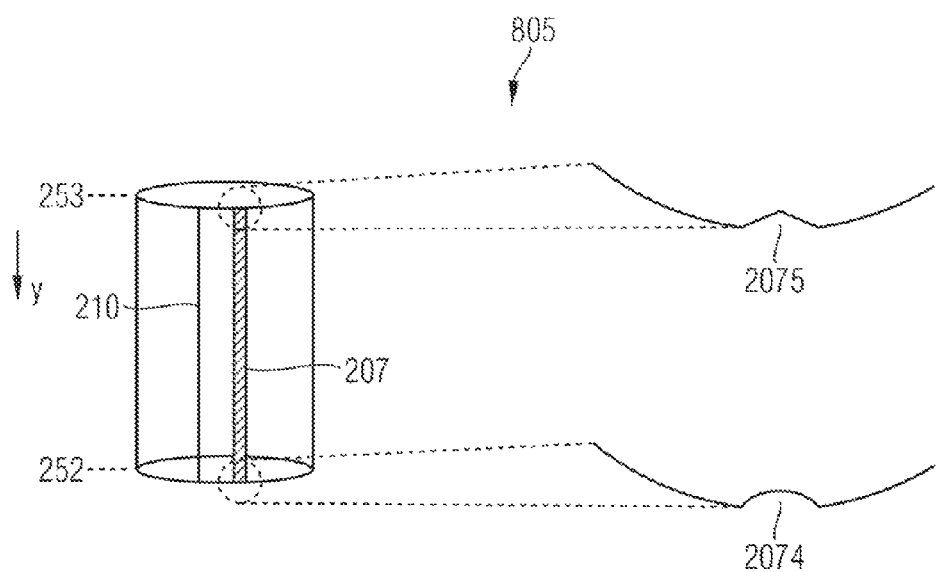

Referring to the schematic view 805 of FIG. 8E illustrating the single crystal ingot 250, the markings 207 extend at a same angular distance from the notch 210 from the first end 252 to the second end 253 of the single crystal ingot 250. A shape of the markings 207 changes from a first shape at the first end 252, for example a semicircular shaped marking 2074 to a second shape at the second end 253, for example a V-groove marking 2075. In the embodiment illustrated in FIG. 8E, the shape of the markings represents the characteristic feature configured to identify a wafer cut from the single crystal ingot 250 with respect to its axial position before slicing. Apart from V-groove and semicircular shaped markings, any other shape may be applied.

Referring to the schematic view 900 of FIG. 9 illustrating an example of a single crystal ingot 258, the single crystal ingot 258 comprises a notch 259 located in a circumference of the single crystal ingot 258 extending along an axial direction y at a constant angular position. The notch 259 at a first axial position is distinguishable from the notch 259 at a second axial position by a characteristic feature. This allows for a traceability of an axial position of a wafer cut from the single crystal ingot 258, for example. Thus, a single notch may be indicative for crystal orientation and axial ingot position of wafers cut from the ingot.

In some embodiments, the characteristic feature is a shape or geometry of the notch 259. By changing a geometry from a first geometry, for example a V-groove (see notch geometry 2591) to a second geometry, for example a semicircular groove (see notch geometry 2592), the notch of a wafer cut from the single crystal ingot 258 may be indicative of crystal orientation and an axial position in the single crystal ingot 258 before dicing.

In some other embodiments, the characteristic feature is an angular extension of the notch 259. By changing an angular extension along the axial direction y of the notch 259, for example between angular extensions $\Delta\theta 6$, $\Delta\theta 7$, the notch of a wafer cut from the single crystal ingot 258 may be indicative of crystal orientation and an axial position in the single crystal ingot 258 before dicing.

In some other embodiments, the characteristic feature is a radial extension of the notch 259. By changing the radial extension along the axial direction y of the notch 259, for example between radial extensions d3 and d4, the notch of a wafer cut from the single crystal ingot 258 may be indicative of crystal orientation and an axial position in the single crystal ingot 258 before dicing.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing semiconductor wafers, comprising:
    forming a notch or a flat in a semiconductor ingot extending along an axial direction;
    forming a plurality of markings in the circumference of the semiconductor ingot, wherein at least some of the plurality of markings at different positions along the axial direction are distinguishable from each other by a characteristic feature, and wherein an entirety of markings at a first axial position of the semiconductor ingot is distinguishable from an entirety of markings at a second axial position of the semiconductor ingot; and thereafter
    slicing the semiconductor ingot into semiconductor wafers.

2. The method of claim 1, wherein the at least some of the plurality of markings at different positions along the axial direction are distinguishable from each other by an angular position relative to the notch or flat.

3. The method of claim 1, wherein the at least some of the plurality of markings at different positions along the axial direction are distinguishable from each other by marking shape.

4. The method of claim 1, wherein the at least some of the plurality of markings at different positions along the axial direction are distinguishable from each other by a radial extension toward a center of the semiconductor ingot.

5. The method of claim 1, wherein the at least some of the plurality of markings at different positions along the axial direction are distinguishable from each other by an angular extension.

6. The method of claim 5, wherein the at least some of the plurality of markings at different positions along the axial direction are positioned at a same angular position.

7. The method of claim 1, wherein the plurality of markings are formed by at least one of laser marking and machining.

8. The method of claim 1, wherein the notch or flat and the plurality of markings are formed in a same process equipment.

9. The method of claim 1, wherein the plurality of markings are formed in the semiconductor ingot by rotating the semiconductor ingot between 0° and 360° around the axial direction while moving a marking position along the axial direction from a first axial position to a second axial position, thereby increasing an angular distance of the markings with increasing distance from the first axial position.

10. The method of claim 9, wherein the marking position is moved along the axial direction by moving the semiconductor ingot relative to a marking process equipment or by moving the marking process equipment relative to the silicon ingot.

11. The method of claim 1, wherein the semiconductor ingot is rotated between 0° and 180° around the axial direction while moving the marking position along the axial direction.

12. The method of claim 1, wherein at least two of the plurality of markings are formed at different angular positions with respect to at least one axial position.

13. A single crystal ingot, comprising:
a notch or a flat extending along an axial direction; and
a plurality of markings in the circumference of the single crystal ingot, wherein at least some of the plurality of markings at different positions along the axial direction are distinguishable from each other by a characteristic feature; and wherein an entirety of markings at a first axial position of the single crystal ingot is distinguishable from an entirety of markings at a second axial position of the single crystal ingot.

14. The single crystal ingot of claim 13, wherein the at least some of the plurality of markings at different positions along the axial direction are distinguishable from each other by an angular position relative to the notch or flat.

15. The single crystal ingot of claim 13, wherein the at least some of the plurality of markings at different positions along the axial direction are distinguishable from each other by marking shape.

16. The single crystal ingot of claim 13, wherein the at least some of the plurality of markings at different positions along the axial direction are distinguishable from each other by a radial extension toward a center of the single crystal ingot.

17. The single crystal ingot of claim 13, wherein the at least some of the plurality of markings at different positions along the axial direction are distinguishable from each other by an angular extension.

18. The single crystal ingot of claim 13, wherein the at least some of the plurality of markings at different positions along the axial direction are positioned at a same angular position.

19. The single crystal ingot of claim 18, wherein the at least some of the plurality of markings differ with respect to a marking shape.

20. The single crystal ingot of claim 13, wherein at least two of the plurality of markings are formed at different angular positions with respect to a same axial position.

21. The single crystal ingot of claim 13, wherein the single crystal ingot is a semiconductor ingot.

* * * * *